(12) United States Patent
Hayashi et al.

(10) Patent No.: US 6,396,079 B1
(45) Date of Patent: *May 28, 2002

(54) THIN FILM SEMICONDUCTOR DEVICE HAVING A BUFFER LAYER

(75) Inventors: Hisao Hayashi; Yasushi Shimogaichi; Keiji Kato, all of Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/730,015

(22) Filed: Oct. 11, 1996

(30) Foreign Application Priority Data

Oct. 13, 1995 (JP) .............................. 7-291788

(51) Int. Cl.[7] .............................................. H01L 29/76
(52) U.S. Cl. ............................................ 257/66; 257/72
(58) Field of Search ............................. 257/55–56, 57, 257/59–66, 72

(56) References Cited

U.S. PATENT DOCUMENTS

| | | | | |
|---|---|---|---|---|
| 4,876,582 A | * | 10/1989 | Janning | 257/66 |
| 4,933,296 A | * | 6/1990 | Parks et al. | 438/30 |
| 5,017,984 A | * | 5/1991 | Tanaka et al. | 257/61 |
| 5,112,764 A | * | 5/1992 | Mitra et al. | 438/163 |
| 5,393,992 A | * | 2/1995 | Suzuki | 257/69 |
| 5,427,962 A | * | 6/1995 | Sasaki et al. | 438/159 |
| 5,523,240 A | * | 6/1996 | Zhang et al. | 438/151 |
| 5,543,635 A | * | 8/1996 | Nguyen et al. | 257/66 |
| 5,552,614 A | * | 9/1996 | Rha | 257/66 |
| 5,583,369 A | * | 12/1996 | Yamazaki et al. | 257/635 |

OTHER PUBLICATIONS

W. Scot Ruska, Microelectronic Processing, McGraw–Hill Book Company, pp. 278–279, 1987.*

* cited by examiner

Primary Examiner—Eddie Lee
Assistant Examiner—George C. Eckert, II
(74) Attorney, Agent, or Firm—Sonnenshein, Nath & Rosenthal

(57) ABSTRACT

A thin film semiconductor device having improved operating characteristics and reliability of a thin film transistor formed on a glass substrate. The thin film semiconductor device has a thin film transistor 3 formed on a glass substrate 1 containing alkali metal. The surface of the glass substrate 1 is covered by a buffer layer 2. The thin film transistor 3 formed on this buffer layer 2 has a polycrystalline semiconductor thin film 4 as an active layer. The buffer layer 2 includes at least a silicon nitride film and protects the thin film transistor 3 from contamination by alkali metals such as Na and has a thickness such that it can shield the thin film transistor 3 from an electric field created by localized alkali metal ions ($Na^+$).

6 Claims, 3 Drawing Sheets

THIN FILM SEMICONDUCTOR DEVICE HAVING A BUFFER LAYER

BACKGROUND OF THE INVENTION

This invention relates to a thin film semiconductor device used as a driving substrate of an active matrix liquid crystal display panel or the like. More particularly, it relates to a thin film semiconductor device using ordinary glass as a substrate and made by low temperature processes. Still more particularly, it relates to technology for preventing adverse affects of alkali metals contained in the glass.

A thin film semiconductor device is a device wherein a thin film transistor is formed on an insulating substrate, and because they are ideal for example for driving substrates of active matrix liquid crystal display panels their development has been being advanced vigorously in recent years. Particularly when using a thin film semiconductor device in a large-area liquid crystal display panel, it is essential to reduce the cost of the insulating substrate, and glass substrates are being employed instead of the relatively high quality quartz substrates used in the past. When a glass substrate is used, because its heat resistance is relatively low, the thin film transistors must be formed by low temperature processes of below 600° C. Now, as a semiconductor thin film constituting active layers of the thin film transistors, amorphous silicon and polycrystalline silicon have been used. However, from the point of view of the operating characteristics of the thin film transistors, polycrystalline silicon is superior to amorphous silicon. For this reason, the development of polycrystalline silicon thin film transistors made by low temperature processes has been being advanced in recent years.

When polycrystalline silicon is used as an active layer of a thin film transistor formed on a glass substrate, contamination caused by alkali metals such as sodium (Na) contained in the glass substrate has been a problem. Polycrystalline silicon is more sensitive to alkali metal contamination than amorphous silicon, and with polycrystalline silicon such contamination has an adverse influence on the operating characteristics and reliability of the thin film transistor. For example, if an alkali metal diffuses into the gate insulating film of a thin film transistor the device characteristics change. When at a high temperature a bias is applied and an operating test is carried out, the device characteristics change greatly because alkali metal in the gate insulating film moves and polarizes and concentrates in localities. Consequently, when thin film transistors have been formed on a glass substrate, the practice of forming in advance as a base layer a silicon nitride film ($SiN_x$) or a phosphorus-containing glass (PSG) as a buffer layer has been carried out. By this buffer layer being interposed, the vertical diffusion of alkali metal from the glass substrate toward the gate insulating film is suppressed and contamination of the gate insulating film is prevented.

However, it has become clear that just preventing vertical movement of alkali metal is not sufficient. That is, horizontal diffusion of alkali metal included in the glass substrate occurs due to bias of the driving voltage impressed on the thin film transistor, and alkali metal ions polarize and concentrate locally. An electric field is created by local polarization of charges of alkali metal ions, and this similarly has an adverse affect on the operating characteristics of the thin film transistor. It has become clear that as a result of this the threshold voltage and the leak current of the thin film transistor undergo fluctuations. It is extremely difficult to prevent this horizontal movement of alkali metal in the glass substrate. For this reason, for example in U.S. Pat. No. 5,349,456 a method for removing Na from a glass substrate is disclosed. However, this method is not always practical because it greatly diminishes the merit of using a low cost glass substrate.

SUMMARY OF THE INVENTION

Accordingly, it is an object of the invention to solve the problem described above and provide a thin film semiconductor device comprising a thin film transistor formed on a glass substrate wherein an electric field arising as a result of horizontal diffusion of alkali metal in the glass substrate is effectively and cheaply prevented from adversely affecting the operating characteristics of the thin film transistor.

To achieve the above-mentioned object and other objects, a thin film semiconductor device according to the invention comprises as a basic construction a glass substrate containing an alkali metal, a buffer layer covering the surface of the glass substrate and a thin film transistor formed on the buffer layer with a polycrystalline semiconductor thin film as an active layer. As a characterizing feature of the invention, the buffer layer includes at least a silicon nitride film and protects the thin film transistor from alkali metal contamination and has a thickness such that it can shield the thin film transistor from an electric field created by localized alkali metal ions. In one form of the invention, the thin film transistor has a bottom gate structure wherein a gate electrode, a gate insulating film and a semiconductor thin film are superimposed in order from the bottom. In this case, the semiconductor thin film has a channel region located directly above the gate electrode, high concentration impurity regions located on either side of the channel region and low concentration impurity regions interposed between the channel region and the high concentration impurity regions. The low concentration impurity regions are shielded from an electric field forming in the glass substrate by the buffer layer. Preferably, the gate insulating film includes a silicon nitride layer and is superimposed with the buffer layer and the two synergetically protect and shield the thin film transistor. In this case, the total thickness of the mutually superposed gate insulating film and buffer layer is over 200 nm. The buffer layer is preferably a two-layer structure made up of a silicon nitride film and a silicon oxide film. In a specific construction, a pixel electrode is formed connected to at least a part of the thin film transistor and the thin film semiconductor device can be used in a driving substrate of an active matrix display panel.

In the invention, a buffer layer is interposed between a glass substrate and a thin film transistor. This buffer layer includes at least a silicon nitride film, and blocks vertical movement of alkali metal and thereby suppresses contamination of the gate insulating film. The silicon nitride film has a fine composition, and by making its thickness above 20 nm it is possible to substantially completely prevent Na and the like from passing through it. Also, in addition to the silicon nitride film this buffer layer includes for example a silicon oxide film and has a two-layer structure. Because film stresses in the silicon oxide film are smaller than in the silicon nitride film it is possible to make the thickness of the buffer layer as a whole large and thereby electrically separate the thin film transistor from the glass substrate. By making the thickness of the buffer layer at least 100 nm it is possible to electrically shield the thin film transistor from the glass substrate. Therefore, it is possible to shield the thin film transistor from adverse affects of an electric field formed as a result of horizontal diffusion of alkali metal inside the glass substrate. As a result, it becomes possible to maintain the reliability and operating characteristics of the thin film transistor even when a glass substrate containing alkali metal is used.

DETAILED DESCRIPTION OF THE PREFERRED EMBODIMENTS

Figure 1:
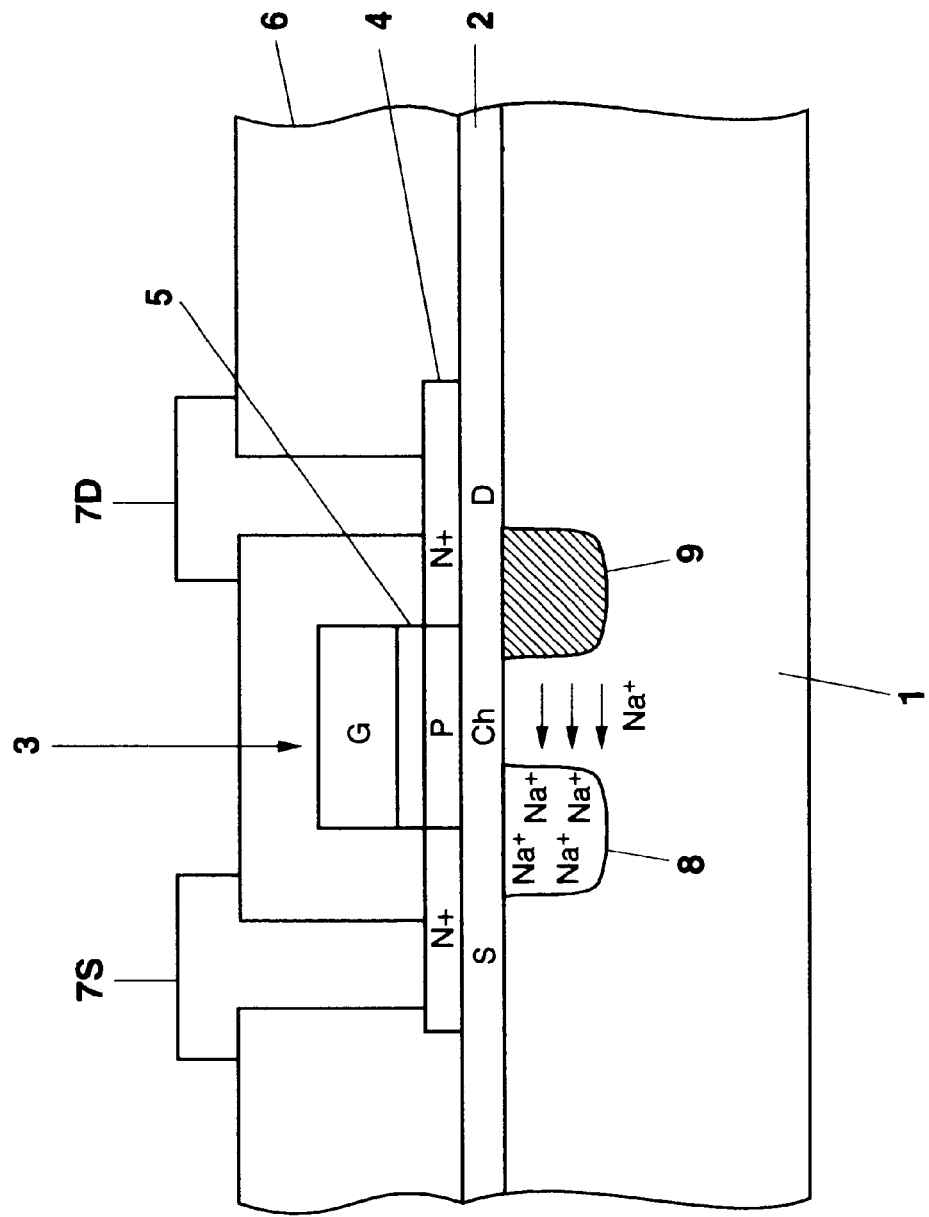
FIG. 1 is a schematic sectional view of a first preferred embodiment of a thin film semiconductor device according to the invention.

Preferred embodiments of the invention will now be described in detail with reference to the accompanying drawings. FIG. 1 shows a first preferred embodiment of a thin film semiconductor device according to the invention, and is an example wherein a thin film transistor of N-channel type and of top gate structure is formed on a glass substrate. As shown in FIG. 1, this thin film semiconductor device is made using a glass substrate 1 containing an alkali metal such as Na. The upper surface of the glass substrate 1 is covered by a buffer layer 2. A thin film transistor 3 is formed on the buffer layer 2. The thin film transistor 3 is a field effect transistor having a polycrystalline semiconductor thin film 4 consisting of polycrystalline silicon or the like as an active layer. The thin film transistor 3 has a top gate structure, and a gate electrode G is formed by patterning on a gate insulating film 5 on the polycrystalline semiconductor thin film 4. As a result, a channel region Ch is formed directly below the gate electrode G with the gate insulating film 5 therebetween. A small amount of a P-type impurity is diffused into this channel region Ch part of the polycrystalline semiconductor thin film 4 for threshold value adjustment. A source region S and a drain region D impregnated with an N-type impurity at a high concentration are provided on opposite sides of the channel region Ch. The thin film transistor 3 having this construction is covered with an interlayer insulating film 6 consisting of PSG or the like. Contact holes are formed in the interlayer insulating film 6, and through these contact holes interconnection electrodes 7S, 7D are electrically connected to the source region S and the drain region D respectively. In this example an N-type impurity is injected to form an N-channel type thin film transistor 3, but of course the invention is not limited to this and can also be applied to a P-channel type thin film transistor.

As a characterizing feature of the invention the buffer layer 2 includes at least a silicon nitride film, and protects the thin film transistor 3 from alkali metal contamination. The silicon nitride film ($SiN_x$) has a relatively fine composition, and by making its thickness at least 20 nm it is possible to substantially completely block the vertical upward diffusion of alkali metals such as Na contained in the glass substrate 1. Also, this buffer layer 2 has a thickness such that it can shield the thin film transistor 3 from an electric field resulting from localized alkali metal ions ($Na^+$) and the like. For example the buffer layer 2 has a two-layer structure made up of the silicon nitride film ($SiN_x$) and a silicon oxide film ($SiO_2$) and has a total thickness of at least 100 nm.

The electric field shielding function of the buffer layer 2, which is a characterizing feature of the invention, will now be described in more detail. When the thin film transistor 3 is operated, there are times when for example a ground potential (0V) is impressed on the interconnection electrode 7S on the source region S side and a positive bias voltage is impressed on the interconnection electrode 7D connected to the drain region D. When this kind of bias is applied to the device, $Na^+$ ions, which are positive charges, are excluded from the vicinity of the drain region D and move horizontally to the vicinity of the source region S. As a result, as shown in FIG. 1, positive charges ($Na^+$) concentrate in the vicinity of the source region S near the surface of the glass substrate 1 and a positive region 8 is formed. Meanwhile, in the vicinity of the drain region D near the surface of the glass substrate 1, because the charge equilibrium breaks down by an amount corresponding to the exclusion of the $Na^+$, a negative region 9 is formed. In this way an electric field resulting from localization of $Na^+$ forms in the vicinity of the surface of the glass substrate 1. The operating characteristics of the thin film transistor 3 are adversely affected by this electric field, resulting in fluctuation of its threshold voltage and increase of its leakage current. To avoid this, in this invention the buffer layer 2 is interposed between the thin film transistor 3 and the glass substrate 1. Because this buffer layer 2 has a two-layer structure made up of $SiN_x$ and $SiO_2$ and has an ample thickness, it substantially completely shields the thin film transistor 3 from electric fields forming in the glass substrate 1. Furthermore, because the buffer layer 2 includes an $SiN_x$ film, it substantially completely blocks vertical movement of Na in the same way as in the related art and thereby prevents contamination of the gate insulating film 5.

Figure 2:
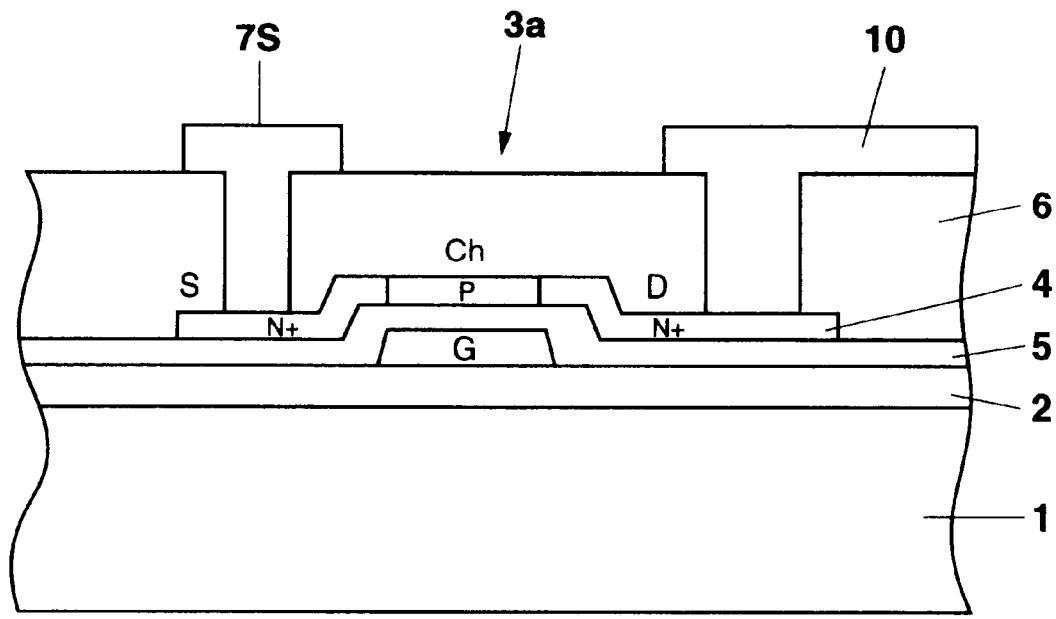
FIG. 2 is a schematic sectional view of a second preferred embodiment of a thin film semiconductor device according to the invention.

FIG. 2 shows a second preferred embodiment of a thin film semiconductor device according to the invention, and shows an example of a bottom gate structure. The basic structure is the same as that of the first preferred embodiment shown in FIG. 1, and corresponding parts have been given the same reference numerals to facilitate understanding. As shown in FIG. 2, a thin film transistor 3a has a bottom gate structure wherein a gate electrode G made of metal or the like, a gate insulating film 5 and a polycrystalline semiconductor thin film 4 are superposed in order from the bottom. The thin film transistor 3a having this construction is protected and shielded from the glass substrate 1 by a buffer layer 2. The thin film transistor 3a is covered by an interlayer insulating film 6, and an interconnection electrode 7S and a pixel electrode 10 are formed on the interlayer insulating film 6. The pixel electrode 10 is electrically connected to the drain region D of the thin film transistor 3a through a contact hole. A thin film semiconductor device having this construction can be used for example in a driving substrate of an active matrix liquid crystal display panel. That is, the thin film transistor 3a is formed as a switching element of a pixel electrode 10.

With the bottom gate structure also, as with the top gate structure shown in FIG. 1, when a bias is impressed on the drain region D side the influence of this bias causes a polarization of the charge distribution in the glass substrate 1 to arise and a positive region and a negative region form. Therefore, the buffer layer 2 is provided to shield the thin film transistor 3a from the influence of electric fields forming in the glass substrate 1. Because in the case of the bottom gate structure the gate electrode G made of metal or the like is interposed between the polycrystalline semiconductor thin film 4 and the glass substrate 1, the proportion of the semiconductor thin film 4 affected by electric fields forming inside the glass substrate 1 is less than in the case of the top gate structure. That is, even if a biased presence of Na were to occur inside the glass substrate 1 below the channel region Ch, because in addition to the buffer layer 2 there is a shielding effect of the gate electrode G, the channel region Ch itself is not so affected by the electric field in the glass substrate 1. Furthermore, in the case of the bottom gate structure, because with respect to the bias between the source region S and the drain region D the gate voltage impressed on the gate electrode G is always at a potential level between the source region and the drain region, biased presences of charges inside the glass substrate 1 would not be expected to occur as much as in the case of the top gate structure.

Figure 3:
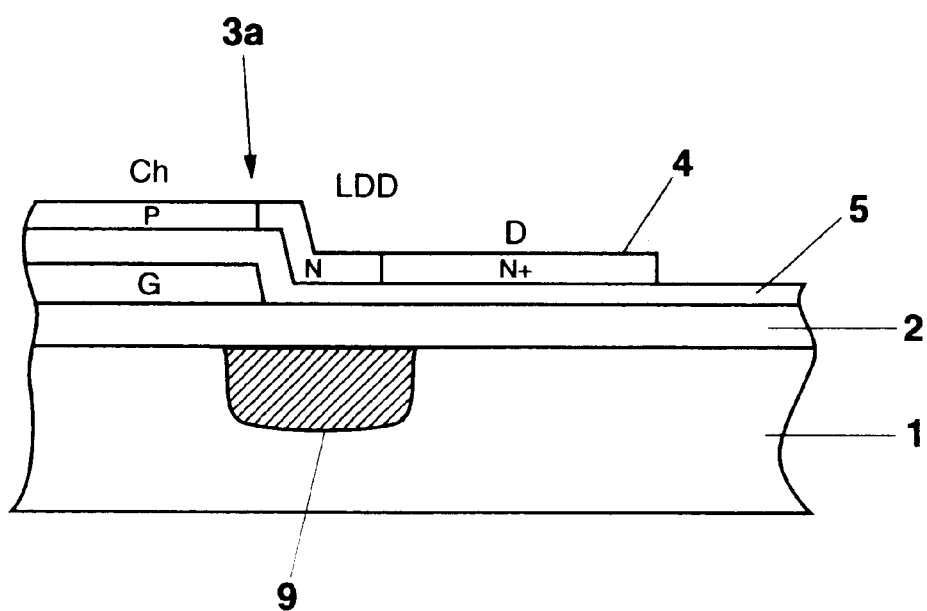
FIG. 3 is a schematic sectional view of a third preferred embodiment of a thin film semiconductor device according to the invention.

FIG. 3 is a partial sectional view of a third preferred embodiment of a thin film semiconductor device according to the invention. This third preferred embodiment is basically the same as the second preferred embodiment shown in FIG. 2, and corresponding parts have been given the same reference numerals to facilitate understanding. The point of difference is that in this third preferred embodiment the thin film transistor has an LDD (Lightly Doped Drain) structure. As shown in FIG. 3, the thin film transistor 3a has a bottom gate structure wherein a gate electrode G, a gate insulating film 5 and a polycrystalline semiconductor thin film 4 are superposed in order from the bottom. The polycrystalline semiconductor thin film 4 has a channel region Ch located directly above the gate electrode G, high concentration impurity regions (N+) located on opposite sides of the channel region Ch and low concentration impurity regions (N) located between the channel region and the high concentration impurity regions. A high concentration impurity region (N+) constitutes a drain region D, and a low concentration impurity region (N) constitutes an LDD region. In FIG. 3 only the drain region D side of the thin film transistor 3a is shown, and the source region S side is omitted. In this example at least the LDD region is shielded from an electric field forming in the negative region 9 of the glass substrate 1 by a buffer layer 2. When an LDD region is formed away from the gate electrode G, unlike the example shown in FIG. 2, as in the case of the top gate structure shown in FIG. 1 the semiconductor thin film is influenced by charges inside the glass substrate 1. For this reason, in this example the buffer layer 2 for weakening the influence of charges is provided between the glass substrate 1 and the polycrystalline semiconductor thin film 4. In this example the gate insulating film 5 includes a silicon nitride layer and is superposed with the buffer layer 2 and the two synergetically protect and shield the thin film transistor 3a. The total thickness of the mutually superposed gate insulating film 5 and buffer layer 2 is over 200 nm. Because in the bottom gate structure the buffer layer 2 and the gate insulating film 5 are superimposed and a synergetic electric field shielding effect is obtained in this way, it is possible to electrically separate the LDD region from the negative region 9 of the glass substrate 1 substantially completely.

Figure 4:
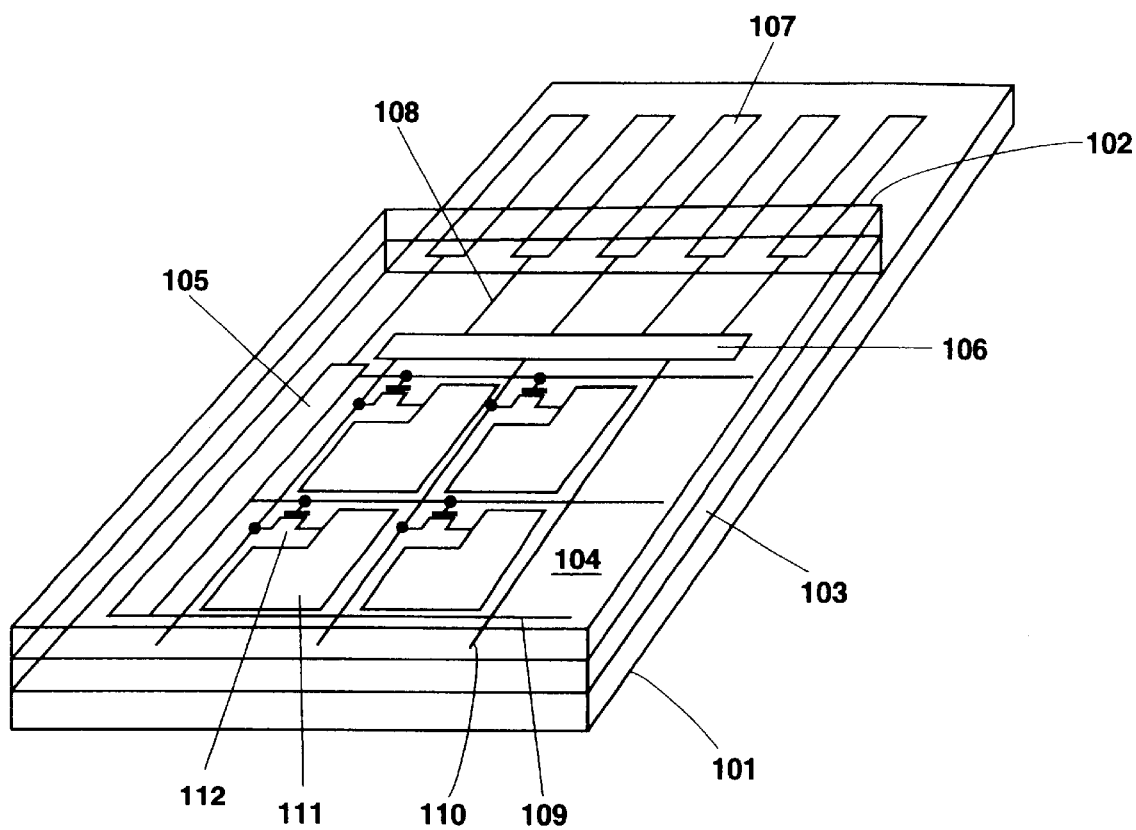
FIG. 4 is a schematic perspective view of an example of an active matrix liquid crystal display panel assembled using a thin film semiconductor device according to the invention.

FIG. 4 is a schematic perspective view showing an example of an active matrix liquid crystal display panel assembled using the thin film semiconductor device shown in FIG. 2 or FIG. 3. As shown in FIG. 4, the liquid crystal display panel is made up of a driving substrate 101 made of glass, a facing substrate 102 also made of glass and a liquid crystal 103 held between the two. A pixel array part 104 and a driving circuit part are formed on the driving substrate 101. The driving circuit part is divided into a vertical driving circuit 105 and a horizontal driving circuit 106. Also, terminal parts 107 for outside connections are formed on a peripheral part of the driving substrate 101. The terminal parts 107 are connected to the vertical driving circuit 105 and the horizontal driving circuit 106 by way of interconnections 108. The pixel array part 104 comprises mutually intersecting gate lines 109 and signal lines 110. The gate lines 109 are connected to the vertical driving circuit 105 and the signal lines 110 are connected to the horizontal driving circuit 106. Pixel electrodes 111 and thin film transistors 112 for switching these are formed at the intersections of the lines 109, 110. Although not shown in the drawing, facing electrodes and color filters are formed on the inner surface of the facing substrate 102. In this invention an ordinary glass material is used as the driving substrate 101, and the thin film transistors 112 and the pixel electrodes 111 are formed on the driving substrate 101 after the surface thereof is covered with a buffer layer. Also, the vertical driving circuit 105 and the horizontal driving circuit 106 are formed at the same time. Therefore, because it is possible to use a cheap glass material, it is possible to make a large-area active matrix liquid crystal display panel at a relatively low cost. At this time, because a buffer layer having both an alkali metal contamination preventing function and an electric field shielding function is used, there is no risk of the glass substrate adversely affecting the reliability or operating characteristics of the thin film transistors.

As described above, according to the invention, a buffer layer is interposed between a glass substrate and a thin film transistor. This buffer layer includes at least a silicon nitride film, and as well as protecting the thin film transistor from alkali metal contamination it has a thickness such that it can shield the thin film transistor from an electric field created by localized alkali metal ions. Consequently, it is possible to avoid suffering the affects of electric fields inside the glass substrate and obtain stable thin film transistor operating characteristics. Also, because it is possible to prevent alkali metal contamination of the thin film transistor, its reliability is improved.

What is claimed is:

1. A thin film semiconductor device comprising:

a glass substrate containing an alkali metal;

a buffer layer at least 100 nm thick covering the surface of said glass substrate, said buffer layer including a first silicon nitride film layer and a silicon oxide film layer, said silicon nitride film layer being at least 20 nm thick, said alkali metal horizontally migrating within said glass substrate and along said first silicon nitride film layer on operation of said thin film semiconductor device;

a bottom gate thin film transistor formed on said buffer layer and having a gate electrode formed on said buffer layer, a gate insulating layer formed on said gate electrode and a polycrystalline semiconductor thin film formed on said gate insulating layer, a part of said gate insulating layer being disposed directly on said buffer layer; and an interlayer insulating layer formed over said thin film transistor, said interlayer insulating layer consisting of PSG, wherein, said gate insulating layer includes a silicon nitride layer and a superimposed portion of said part of the gate insulating layer and said buffer layer has a thickness of at least 200 nm, said buffer layer is effective to prevent vertical migration of alkali metal into said polycrystalline semiconductor thin film, and said buffer layer is effective to electrically insulate the transistor from electrical fields arising from horizontal migration of alkali metal within the substrate.

2. A thin film semiconductor device according to claim 1, wherein a pixel electrode is formed connected to at least a part of said thin film transistor.

3. A thin film semiconductor device according to claim 1, wherein said polycrystalline semiconductor film has source and drain regions formed on said gate insulating layer spaced apart from one another to define therebetween a channel region and a low concentration impurity region formed between said channel region and drain region.

4. A thin film semiconductor device according to claim 3, wherein said low concentration impurity region is shielded from an electric field generated in said glass substrate by said buffer layer.

5. A thin film semiconductor device according to claim 1, wherein said first silicon nitride film has a thickness of at least 20 nm.

6. A thin film semiconductor device comprising:
 a glass substrate containing an alkali metal;
 a buffer layer at least 100 nm thick covering the surface of said glass substrate, said buffer layer including a first silicon nitride film layer and a silicon oxide film layer, said silicon nitride film layer being at least 20 nm thick, said alkali metal horizontally migrating within said glass substrate and along said first silicon nitride film layer on operation of said thin film semiconductor device;
 a thin film transistor formed on said buffer layer and having a polycrystalline semiconductor thin film formed on said buffer layer, a gate insulating layer formed on said polycrystalline semiconductor thin film and a gate electrode formed on said gate insulating layer; and
 an interlayer insulating layer formed over said thin film transistor, said interlayer insulating layer consisting of PSG,
 wherein,
  said gate insulating layer includes a silicon nitride layer,
  said buffer layer is effective to prevent vertical migration of alkali metal into said polycrystalline semiconductor thin film, and
  said buffer layer is effective to electrically insulate the transistor from electrical fields arising from horizontal migration of alkali metal within the substrate.

* * * * *